June 13, 1961 R. F. RUTZ 2,988,652
BISTABLE TRANSISTOR CIRCUIT USING 6-TERMINAL TRANSISTOR WHICH
ACTS AS TWO INDEPENDENT TRANSISTORS
Original Filed May 20, 1955

INVENTOR.
RICHARD F. RUTZ
BY Lester H. Clark
ATTORNEY 2,988,652

BISTABLE TRANSISTOR CIRCUIT USING 6-TERMINAL TRANSISTOR WHICH ACTS AS TWO INDEPENDENT TRANSISTORS

Richard F. Rutz, Fishkill, N.Y., assignor to International Business Machines Corporation, New York, N.Y., a corporation of New York Original application May 20, 1955, Ser. No. 509,852. Divided and this application Feb. 17, 1958, Ser. No. 715,635

4 Claims. (Cl. 307—88.5)

Figure 1:
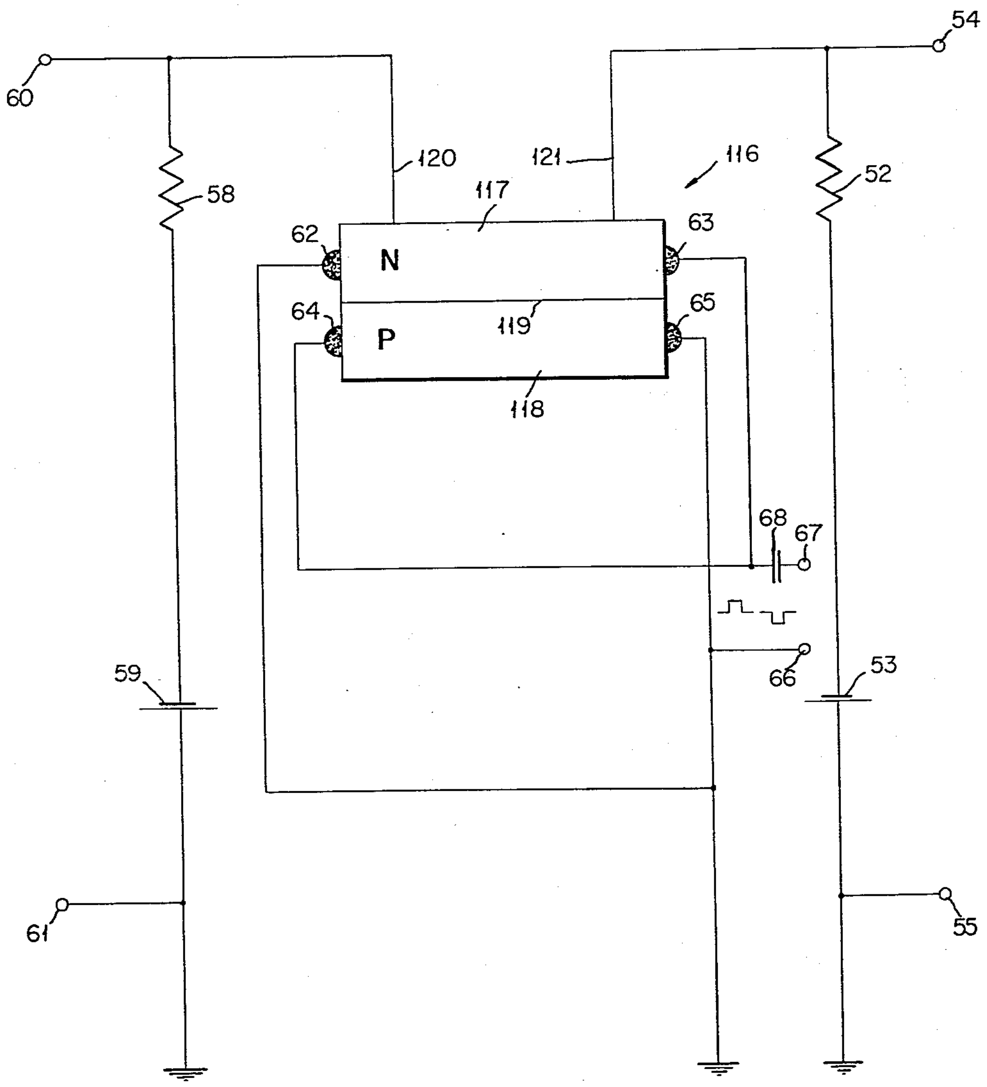

This is a division of my copending application Serial No. 509,852, filed May 20, 1955, entitled "Multiple Collector Transistors and Circuits Therefor," which is in turn a continuation-in-part of my application Serial No. 458,619, filed September 27, 1954, now Patent No. 2,889,499, entitled "Transistor Circuit Element."

There are shown and described in said application Serial No. 458,619, transistors comprising a body of semi-conductive material including two thin regions of substantially equal area and of opposite conductivity types, the two regions separated by a boundary junction. One of the two regions has a thickness substantially no greater than the diffusion length for the average lifetime of minority carriers in the material of that region. The second region has a resistivity substantially lower than (e.g. approximately equal to one-tenth) that of the first region and is sufficiently thin so that when provided with an ohmic electrical connection over most of its area, there is substantially no potential gradient throughout it. A high alpha collector is connected to the first-mentioned zone at the surface thereof on the opposite side from the junction. The junction, or part of it, serves as an emitter for minority carriers traveling toward the collector. The flow of minority carriers from the junction is controlled by an electric field impressed across the higher resistivity region and effective to produce a potential gradient therein which determines how great a proportion of the junction is forwardly biased so as to emit minority carriers.

In accordance with the invention claimed in my application Serial No. 509,852, the transistors of my earlier application were modified by the addition of a second collector on the same side of the high resistivity region as the first collector. The distribution of current flow between the two collectors is determined by an electric field impressed across the region of higher resistivity.

The present invention is concerned with modified forms of the transistors and circuits described in the previous application. According to the present invention, both regions may be made to have substantial resistivity and potential gradients may be produced in one or both of the two semi-conductive regions.

A transistor of the type described herein, is useful in the construction of many different types of circuits, including bistable circuits. Among the bistable circuits may be mentioned triggers and latches.

An object of the present invention is to provide a transistor having two collectors, and improved means for controlling the distribution of current between the two collectors.

Another object is to provide improved circuits employing transistors of the type described.

Another object is to provide improved bistable circuits, including triggers and latches, employing transistors of the type described.

The foregoing objects are attained in the transistors and circuits described herein by providing a transistor comprising a body of semi-conductive material including two regions of substantially equal area and opposite conductivity types separated by a boundary junction. A first one of the regions has a thickness substantially no greater than the diffusion length for the average lifetime of minority carriers in the material of that region. Two collectors are in electrical contact with that first region on the surface thereof opposite the junction, and are spaced apart by a distance substantially greater than the diffusion length. The boundary junction serves as an emitter for the two collectors. Both regions have substantial resistivity. The emission of minority carriers from the junction is controlled by controlling the potential gradients across the respective regions, thereby determining the polarity and magnitude of the bias across the respective portions of the junction opposite the respective collectors.

Other objects and advantages of the invention will become apparent from a consideration of the following specification and claims taken together with the accompanying drawings.

The single figure of the drawing is an electrical wiring diagram of a trigger circuit embodying the invention.

The drawing illustrates a trigger circuit employing a transistor indicated generally at 116. This transistor comprises an N region 117 separated from a P region 118 by a boundary junction 119. Two electrodes 120 and and 121 having high intrinsic current amplification when biased as collectors are in electrical contact with the surface of region 117 opposite to junction 119. The electrodes 120 and 121 are spaced apart by a distance substantially greater than the diffusion length for the average lifetime of minority carriers in the region 117. The thickness of the N region 117 is substantially no greater than the diffusion length for the average lifetime of the minority carriers in that region. The transistor 116 differs from the transistors of my applications Serial No. 509,852 and No. 458,619, in that the resistivity of the P region 118 is substantially higher than the resistivities of the corresponding regions in the previous structures, which had resistivities about one-tenth the resistivities of the regions corresponding to region 117. The resistivity of region 118 is substantially lower than that of region 117, being, for example, approximately one-half the resistivity of region 117. However, since it is desired in the transistor 116 to establish a substantial potential gradient across the P region 118, it is made with a substantial resistivity. This reduces the emitting efficiency of the junction 119 somewhat, as compared to the junctions between regions having a ratio of resistivities of ten to one, but a compromise must be selected between the two desired ends, namely a high potential gradient across region 118 and a high emitting efficiency for the junction 119.

The transistor 116 is connected in a bistable circuit, specifically a trigger circuit. Electrode 120 is connected through a load resistor 58 and a load supply battery 59 to ground. An output terminal 60 is connected to electrode 120, and an output terminal 61 is connected to ground. Electrode 121 is connected through load resistor 52 and load supply battery 53 to ground. Output terminal 54 is connected to electrode 121 and terminal 55 to ground.

Ohmic connections 62, 63 are provided at the opposite ends of the N region 117. Ohmic connections 64, 65 are provided at opposite ends of the P region 118. An input terminal 66 is connected to ground and also to the diagonally opposite ohmic connections 62 and 65. Another input terminal 67 is connected through a coupling capacitor 68 to the other two diagonally opposite ohmic connections 63 and 64.

*Operation*

When there is no signal at the input terminals 66 and 67, then the left-hand half of junction 119 is reversely biased, since the left-hand end of N region 117 is grounded and the left-hand end of P region 118 is connected to the right-hand end of N region 117, which is biased negatively by the load supply battery 53. For similar reasons, the right-hand half of junction 119 is biased forwardly and serves as an emitter of minority carriers to the electrode 121, which serves as a collector, so that a high current flows through collector 121, and substantially no current through electrode 120.

A positive signal applied at the input terminals 66 and 67 reverses the situation described above, since the left-hand half of the junction 119 becomes forwardly biased and the right-hand half negatively biased. If the positive signal terminates, then the previous conditions are restored. They may also be restored by a negative signal appearing at terminals 66 and 67.

The bistable circuit illustrated therefore operates as a trigger swinging between a normal bistable state when the input signal is zero or negative and the opposite bistable state when a positive signal is received.

I claim:

1. A transistor comprising a body of semi-conductive material including two thin regions of opposite conductivity types, each said region being defined in part by two opposed faces each face having an extent in at least one direction substantially greater than the thickness of the region, said regions having a common interface defining one face of each region and serving as a boundary junction, one of said regions having a thickness substantially no greater than the diffusion length for the average lifetime of minority carriers in the material thereof, the other of said regions having a resistivity substantially lower than said one region, two collectors having high intrinsic current amplification in electrical contact with said one region on the face thereof opposite said junction and spaced from said junction by the thickness of said one region, said collectors being spaced from each other in said one direction by a distance substantially greater than said diffusion length, and means for controlling the potential gradient in said one direction across both of said regions to determine the polarity and magnitude of the bias across the portions of said junction opposite the respective collectors and thereby the respective rates of emission of minority carriers from said junction portions.

2. A bistable circuit including a transistor comprising a body of semi-conductive material including two thin regions of opposite conductivity types, each said region being defined in part by two opposed faces, each face having an extent in at least one direction substantially greater than the thickness of the region, said regions having a common interface defining one face of each region and serving as a boundary junction, one of said regions having a thickness substantially no greater than the diffusion length for the average lifetime of minority carriers in the material thereof, the other of said regions having a resistivity substantially lower than said one region, two collectors having high intrinsic current amplification in electrical contact with said one region on the face thereof opposite said junction and spaced from said junction by the thickness of said one region, said collectors being spaced from each other in said one direction by a distance substantially greater than said diffusion length, signal output means connected to the ends of at least one collector, and signal input means electrically connected to at least one of said regions and shiftable between signal and no-signal conditions for controlling the potential gradient across both said regions in said one direction to determine the polarity and magnitude of the bias across said junction opposite the respective collectors, and thereby the rate of emission of minority carriers from the junction portion opposite said one collector, said signal input means being effective in one of said conditions to establish a substantial flow of minority carriers from said junction portion toward said one collector, and in the other of said conditions to reverse bias said junction portion and cut off the flow of minority carriers toward said one collector, said signal input means including a pair of input terminals, means coupling one input terminal to one end of one region and the opposite end of the other region, and means coupling the other input terminal to the opposite end of said one region and to the one end of said other region, so that a potential applied between said input terminals establishes a potential gradient in one sense through one of the regions and in the opposite sense through the other region.

3. A bistable circuit including a transistor comprising a body of semi-conductive material including two thin regions of opposite conductivity types, each said region being defined in part by two opposed faces, each face having an extent in at least one direction substantially greater than the thickness of the region, said regions having a common interface defining one face of each region and serving as a boundary junction, one of said regions having a thickness substantially no greater than the diffusion length for the average lifetime of minority carriers in the material thereof, the other of said regions having a resistivity substantially lower than said one region, two collectors having high intrinsic current amplification in electrical contact with said one region on the face thereof opposite said junction and spaced from said junction by the thickness of said one region, said collectors being spaced from each other in said one direction by a distance substantially greater than said diffusion length, signal output means connected to at least one collector, and signal input means electrically connected to at least one of said regions and shiftable between signal and no-signal conditions for controlling the potential gradient across said last-mentioned one region in said one direction to determine the polarity and magnitude of the bias across said junction opposite at least said one collector, and thereby the rate of emission of minority carriers from the junction portion opposite said one collector, said potential gradient controlling means including said collectors and electric potential supply means connected to said collectors, said signal input means being effective in one of said conditions to establish a substantial flow of minority carriers from said junction portion toward said one collector, and in the other of said conditions to reverse bias said junction portion and cut off the flow of minority carriers toward said one collector.

4. A bistable circuit comprising an elongated transistor body including first and second regions of opposite intrinsic conductivity types extending lengthwise of the body from end to end and separated by a boundary junction, means coupling one end of the first region and the other end of the second region to a first input terminal, means coupling the other end of the first region and the one end of the second region to a second input terminal, so that a signal applied to said terminals establishes potential gradients in opposite senses along said first and second regions, and two collector electrodes in electrical contact with one of said regions on the side thereof opposite said boundary junction, means supplying bias potentials to said collectors, said collectors being spaced lengthwise of said body, said opposite potential gradients being effective to bias the portion of the junction opposite one only of said collectors in a sense to emit minority carriers therefrom toward said one collector, so that one or the other of said collectors is rendered conductive by an input signal, the particular collector depending on the polarity of the input signal.

References Cited in the file of this patent

UNITED STATES PATENTS

| | | |
|---|---|---|
| 2,586,080 | Pfann | Feb. 19, 1952 |
| 2,801,348 | Pankove | May 3, 1954 |
| 2,883,313 | Pankove | Apr. 21, 1959 |